(12) United States Patent
Len et al.

(10) Patent No.: US 11,729,933 B2
(45) Date of Patent: Aug. 15, 2023

(54) NEAR-HERMETIC PACKAGE WITH FLEXIBLE SIGNAL INPUT AND OUTPUT

(71) Applicant: TTM TECHNOLOGIES NORTH AMERICA, LLC, Santa Ana, CA (US)

(72) Inventors: Michael Len, Santa Ana, CA (US); Nicholas S. Koop, Santa Ana, CA (US); Andrew Kempf, Santa Ana, CA (US); Matt Gortner, Santa Ana, CA (US)

(73) Assignee: TTM Technologies, Inc., Santa Ana, CA (US)

( * ) Notice: Subject to any disclaimer, the term of this patent is extended or adjusted under 35 U.S.C. 154(b) by 0 days.

(21) Appl. No.: 17/590,420

(22) Filed: Feb. 1, 2022

(65) Prior Publication Data

US 2022/0248553 A1 Aug. 4, 2022

Related U.S. Application Data

(60) Provisional application No. 63/145,408, filed on Feb. 3, 2021.

(51) Int. Cl.
| | |
|---|---|
| *H05K 5/02* | (2006.01) |
| *H05K 1/14* | (2006.01) |
| *H05K 1/18* | (2006.01) |
| *H05K 5/00* | (2006.01) |
| *H05K 5/06* | (2006.01) |

(52) U.S. Cl.
CPC .......... *H05K 5/0247* (2013.01); *H05K 1/147* (2013.01); *H05K 1/189* (2013.01); *H05K 5/0004* (2013.01); *H05K 5/069* (2013.01); *H05K 2201/056* (2013.01); *H05K 2201/2018* (2013.01)

(58) Field of Classification Search
CPC ...... H05K 5/0247; H05K 1/147; H05K 1/189; H05K 5/0004; H05K 2201/056; H05K 2201/2018
USPC .......................................................... 36/749
See application file for complete search history.

(56) References Cited

U.S. PATENT DOCUMENTS

| | | |
|---|---|---|
| 5,072,283 A | 12/1991 | Bolger |
| 2004/0042183 A1 | 3/2004 | Alcaria et al. |
| 2008/0019106 A1 | 1/2008 | Wetzel et al. |
| 2008/0289862 A1 | 11/2008 | Yagisawa et al. |
| 2014/0077924 A1 * | 3/2014 | Len .......................... H01C 1/00 338/314 |
| 2015/0229976 A1 | 8/2015 | Bulkowski et al. |
| 2020/0288576 A1 * | 9/2020 | Len .......................... H05K 3/42 |

* cited by examiner

*Primary Examiner* — Andargie M Aychillhum
(74) *Attorney, Agent, or Firm* — Polsinelli PC

(57) ABSTRACT

The disclosure provides a low-cost near-hermetic package, which may a substrate configured to support one or more internal components. The package may also include an enclosure comprising a cavity surrounding the one or more internal components and a first sidewall extending upward from the substrate. The first sidewall may be coupled to the substrate. The package may further include a first flexible circuit comprising conductive traces configured to connect to the one or more internal components. The first flexible circuit may include a first section outside the first sidewall of the enclosure, a second section inside the enclosure, and a third section between the first section and the second section joining to the enclosure and the substrate.

18 Claims, 11 Drawing Sheets

NEAR-HERMETIC PACKAGE WITH FLEXIBLE SIGNAL INPUT AND OUTPUT

CROSS-REFERENCE TO RELATED PATENT APPLICATIONS

This patent application claims the benefit under 35 U.S.C. § 119(e) of U.S. patent application Ser. No. 63/145,408, entitled "Hermetic or Near-Hermetic Package With Flexible Signal Input and Output," filed on Feb. 3, 2021, and the benefit under 35 U.S.C. § 119(e) of U.S. patent application Ser. No. 63/145,900, entitled "Near-Hermetic Package With Flexible Signal Input and Output," filed on Feb. 4, 2021, each of the foregoing is incorporated herein by reference in its entirety.

FIELD

The disclosure is directed to a low-cost hermetic or near-hermetic package including a flexible circuit for signal input and output from the package.

BACKGROUND

In microelectronics, the term "hermetic" implies an airtight seal that will keep moisture and other harmful gases from penetrating the sealed package. Metals, ceramics, and glasses can be used to form a hermetic seal and prevent water vapor from accessing components inside the package. A properly made hermetic seal with a sufficiently low leak rate can keep a package dry and moisture-free for many years.

In "near hermetic" plastic packages, one issue is moisture diffusion through the bulk material, along with the interface of a lid seal and feedthrough to the package.

The conventional methods for signal I/O from hermetic and near-hermetic packages include (1) glass feed-through; (2) ceramic feed-through; and (3) vias through the package base. In the feed-through approaches, either glass feed-through or ceramic feed-through, the feed-through(s) come out from the side or base of the package, which can be round or flat leads, or can be a ceramic substrate with conductive traces. In the vias through approach, surface-mount technology ("SMT") pads are placed on the base of the package with vias through the base of the package.

BRIEF SUMMARY

The disclosure provides a package with a near-hermetic seal from moisture. In one aspect, the package may include a substrate configured to support one or more internal components. The package may also include an enclosure comprising a cavity surrounding the one or more internal components and a first sidewall extending upward from the substrate. The first sidewall may be coupled to the substrate. The package may further include a first flexible circuit comprising conductive traces configured to connect to the one or more internal components. The first flexible circuit may include a first section outside the first sidewall of the enclosure, a second section inside the enclosure, and a third section between the first section and the second section joining to the enclosure and the substrate.

In another aspect, a package with a near-hermetic seal from moisture may include a substrate configured to support one or more internal components. The package may also include an enclosure including a cavity surrounding the one or more internal components and a first sidewall and a second sidewall extending upward from the substrate, the first and second sidewalls coupled to the substrate. The package may also include a first flexible circuit including conductive traces configured to connect to the one or more internal components. The first flexible circuit may include a first section outside the first sidewall of the enclosure, a second section inside the enclosure, and a third section between the first section and the second section joining to the enclosure and the substrate.

In some aspects, a PCB assembly may include the package with a near-hermetic seal from moisture. The flexible circuit may be configured to connect to a PCB such that the PCB is on the same side as the package. The flexible circuit may also be configured to connect to a PCB such that the PCB is on the opposite side of the package. The flexible circuit may also be configured to connect to a PCB such that the PCB is away from the package. The flexible circuit may also be configured to connect to a PCB such that the PCB is close to the package.

Additional aspects, embodiments, and features are set forth in part in the description that follows, and will become apparent to those skilled in the art upon examination of the specification or may be learned by the practice of the disclosed subject matter. A further understanding of the nature and advantages of the disclosure may be realized by reference to the remaining portions of the specification and the drawings, which form a part of this disclosure.

BRIEF DESCRIPTION OF THE DRAWINGS

The description will be more fully understood with reference to the following figures and data graphs, which are presented as various embodiments of the disclosure and should not be construed as a complete recitation of the scope of the disclosure, wherein:

FIG. 10 illustrates a cross-sectional view of the hermetic or near-hermetic package including a flexible circuit with a lid and internal components mounted on a portion of the flexible circuit in accordance with an embodiment of the disclosure;

DETAILED DESCRIPTION

Figure 1A:
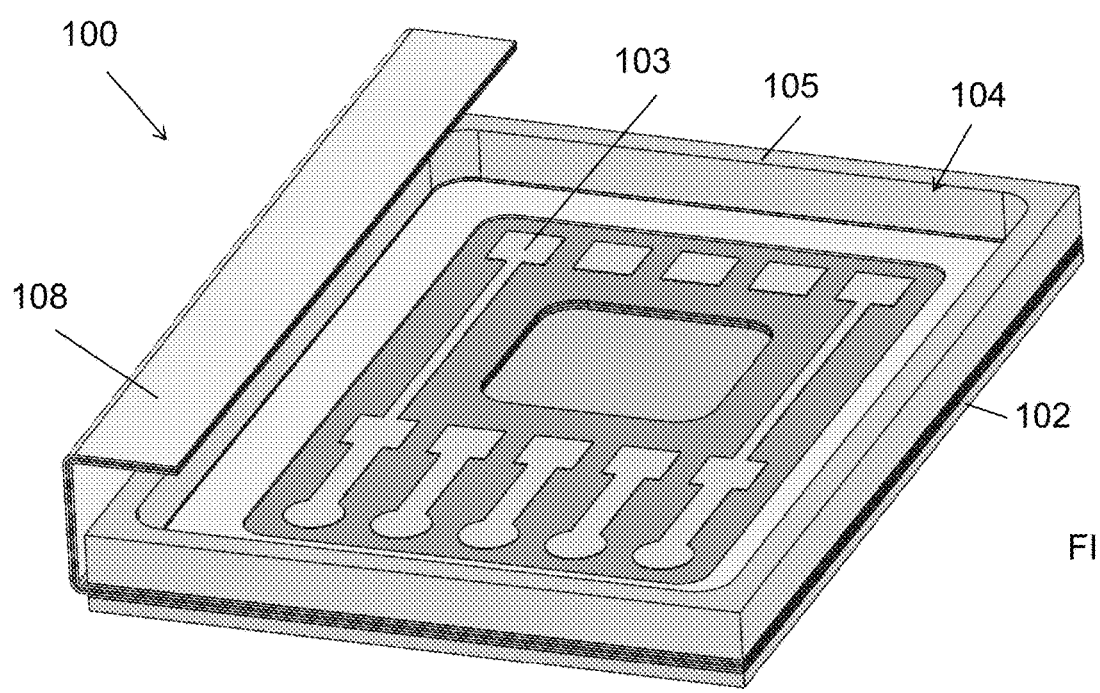
FIG. 1A illustrates a perspective view of a hermetic or near-hermetic package including a flexible circuit without a lid in accordance with an embodiment of the disclosure.

The disclosure may be understood by reference to the following detailed description, taken in conjunction with the drawings as described below. It is noted that, for purposes of illustrative clarity, certain elements in various drawings may not be drawn to scale.

The disclosure provides a low-cost near-hermetic package for electronics, microelectronics, or photonics. The near-hermetic package includes a flexible circuit attached between a lower substrate and an upper enclosure. The near-hermetic package also includes electrical components and/or optical components mounted on the substrate and placed inside the upper enclosure. The upper enclosure, the lower substrate, and the flexible circuit are all joined together to create a hermetic or near-hermetic package with flexible signal input/output (I/O) distributions.

The flexible circuit may include conductive circuit traces or patterns between a thin insulating polymer film to which the conductive circuit traces or patterns adhere, and a thin polymer coating to protect the conductive circuit trace patterns. For example, the insulating polymer film and the polymer coating may be formed of polyimide.

The disclosed package has several benefits, including (1) flexible signal I/O; (2) high-performance copper conductors for the signal I/O; (3) near-hermetic package; (4) low-cost packaging materials, flexible circuit materials, and manufacturing process, and high volume manufacturing process.

First, the package provides a low-cost, high degree of position flexibility and/or location flexibility for signal I/O from the near-hermetic package. The package incorporates a flexible circuit to allow flexible signal I/O connectivity or signal distribution, including I/O of electrical signals, optical signals, or their combinations from the package. The flexible circuit allows the signal connectivity to be in various orientations and various distances from the package. For example, the flexible circuit can be farther away from the package than standard hermetic and near-hermetic package interconnection methods. The flexible circuit can be as long as needed to make a connection farther away from the hermetic package.

This flexibility of varying length cannot be achieved with the conventional hermetic pins or leads, which are near the perimeter of the package to connect to the PCB on which the pins or leads are mounted. The conventional technology utilizes either SMT, ball grid array ("BGA"), pins, or flat leads for the signal input/output from the package. Existing hermetic and near-hermetic packages require the signal I/O to be connected to the next level assembly very close to the hermetic package, either directly above/below or directly on the sides of the package. The integration of the flexible circuit into the package allows the I/O connections to be moved much further away and to be in different orientations from the hermetic package.

Second, the disclosed package provides low-stress interconnection or stress relief to the I/O signal connection, which provides high-performance copper conductors for the signal I/O and thus improves reliability. Typical hermetic and near-hermetic packages use glass or ceramic feed-through with a metal pin or lead. The pin is rigid. Due to coefficient of thermal expansion ("CTE") mismatch between the hermetic package and the PCB that it is mounted to, thermal stress is generated during thermal cycling and may result in the pin failing, or the pin to PCB solder joint failure, or PCB pad being pulled off. The flexible circuit helps eliminate the risk due to its flexibility.

Third, the disclosure provides a few sealing options for the hermetic or near-hermetic package. For example, the package may include an enclosure including a lid or cover to seal a ring frame. The ring frame with the lid may be formed of metals, ceramic, PCB materials, or plastic. The package may also include an enclosure potted or encapsulated with a polymer, e.g. epoxy. The package may also include an enclosure that is a single-piece cover and can be molded, stamped or drawn, or molded.

Fourth, the base substrate, the flexible circuit, and the enclosure can use different materials selected for desired properties or features in different sections of the package, which allows low-cost packaging materials, flexible circuit materials, and fabrication process, and also high volume manufacturing process.

The disclosure provides various methods to join the lower substrate and the enclosure (e.g. ring frame), including (1) PCB bonding films, such as epoxy prepreg or a thermoplastic (e.g. PTFE, perfluoroalkoxy alkanes ("PFA")); (2) Pressure Sensitive Adhesives ("PSA"); (3) Epoxy; (4) Solder; and (5) Fusion Bond, among others.

The disclosure also provides various methods to mount internal components by using solder, epoxy, or PSA, among others.

The disclosure further provides various methods to attach the component's electrical signal I/O to the signal I/O of the flexible circuit of the package, including wire bonding, SMT, or using leads by using solder, weld, or conductive epoxy.

In some aspects, the disclosed hermetic or near-hermetic packages can be used for any electronic and optical components.

In some aspects, the disclosed hermetic or near-hermetic packages can be used in the photonics industry. For example, the disclosed near-hermetic packages can be used for optical transceiver modules.

FIG. 1A illustrates a perspective view of a hermetic or near-hermetic package including a flexible circuit without a lid in accordance with an embodiment of the disclosure. As shown in FIG. 1A, a hermetic or near-hermetic package includes a lower base substrate 102 and a ring frame 104 having a sidewall 105 extending upward vertically from the lower base substrate 102. The package 100 includes a flexible circuit 108 integrated with the enclosure and the base substrate. Within the sidewall 105 of the enclosure, conductive traces 103 can be part of the base substrate and configured for electrical and/or optical components to be mounted on. The electrical components may be surface-mount technology (SMT) components.

Figure 1B:
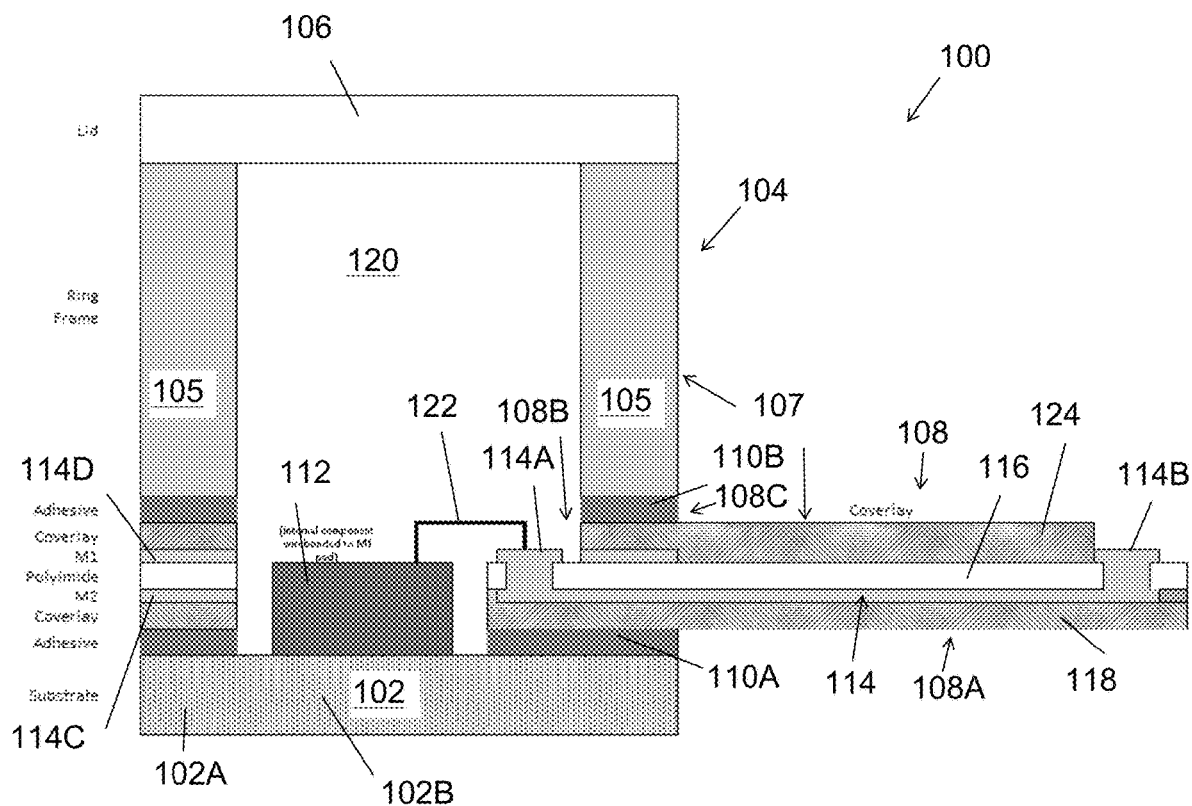
FIG. 1B illustrates a cross-sectional view of the hermetic or near-hermetic package including a flexible circuit with a lid and internal components mounted on a substrate in accordance with an embodiment of the disclosure.
Figure 1C:
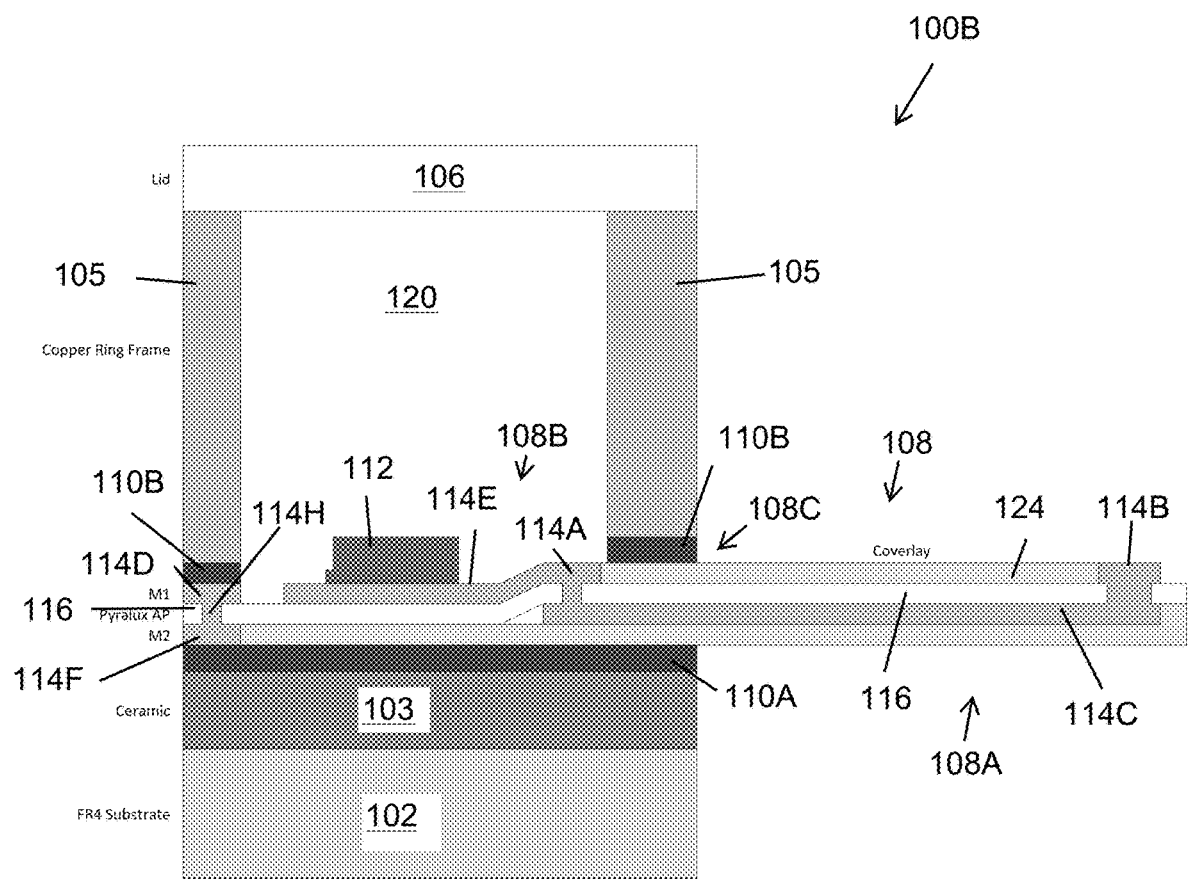
FIG. 1D illustrates a cross-sectional view of the hermetic or near-hermetic package including a flexible circuit with a lid and internal components mounted on a portion of the flexible circuit in accordance with another embodiment of the disclosure.

FIG. 1B illustrates a cross-sectional view of the hermetic or near-hermetic package including a flexible circuit with a lid and internal components mounted on a substrate in accordance with an embodiment of the disclosure. As shown in FIG. 1B, the hermetic or near-hermetic package 100A may include the lower base substrate 102 and the upper enclosure 104 (e.g. ring frame), and the flexible circuit 108. The hermetic or near-hermetic package 100A has a hermetic seal or near-hermetic seal from moisture. The lower base substrate 102 includes an outer edge portion 102A corresponding to the bottom of the sidewall 105 of the enclosure or ring frame. The lower base substrate 102 also includes an inner portion 102B inside the sidewall 105. As shown, internal components 112 are mounted on the inner portion 102B of the substrate 102. The internal components 112 can be either electrical components, optical components, or a combination of both. The upper enclosure 104 includes a cavity 120 surrounding the internal components 112 and a sidewall 105 coupled to the outer edge portion 102A of the substrate 102 through the flexible circuit.

The package 100A integrates the flexible circuit 108 for the signal I/O. The components 112 can be mounted onto substrate 102. Cavity 120 can be sealed to form a hermetic or near-hermetic package.

The flexible circuit 108 may include a first section 108A extending from the sidewall 105 of enclosure 104 to be away from enclosure 104. and a second section 108B extending into the enclosure 104. The flexible circuit 108 may also include a third section 108C joining to the substrate and the enclosure. The flexible circuit 108 is in electrical communication or optical communication, or electrical and optical communications with the internal components 112. The flexible circuit 108 can extend into the sidewall 105 of the enclosure, with the second section inside the enclosure. The flexible circuit 108 can extend from the sidewall 105 of enclosure 104, with the first section outside the enclosure being away from the enclosure.

In some aspects, the length and width of the flexible circuit 108 may vary to meet the need of a particular application. The flexible circuit 108 can also be changed easily to change its orientation or its angle from the sidewall 105 of the enclosure. The angle 107 between the sidewall 105 of the enclosure and the flexible circuit 108 may vary between 0° and 180°.

The flexible circuit 108 may include conductive traces 114 between a polymer coating 116 and a bottom cover layer 118, which is an insulating polymer film. The polymer coating 116 and the bottom cover layer 118 may be formed of polyimide, among others.

The conductive traces 114 are configured to connect to the electrical components or optical components 112 inside the enclosure 104 for inputting or outputting electrical signals, optical signals, or a combination of both electrical and optical signals. The conductive trace 114 is configured to connect to an external component for outputting a signal, for example, the flexible circuit may be connected to a PCB. For example, the conductive traces 114 may include an inner end portion 114A that is inside sidewall 105 of enclosure 104 and can be connected to components 112 by wire bond 122. The inner end portion 114A may extend above the polymer coating 116 and protrude from the polymer coating 116. The inner end portion 114A may also be exposed from the polymer coating 116.

The conductive traces 114 may also include an output end portion 114B that is outside the enclosure 104 and can be connected to an external component. The conductive traces 114 may also include an inner trace portion 114C that can connect the outer end portion 114B to the components 112 through the inner end portion 114A. The inner trace portion 114C is in a metal layer M2 between the polymer coating 116 and the bottom cover layer 118.

The conductive traces 114 may further include an outer trace portion 114D routed on the top of the polymer coating 116. The outer trace portion 114D is in a metal layer M1. The outer trace portion 114D is under the bottom of the sidewall 105 of the enclosure. The flexible circuit 108 may also include a top cover layer 124 disposed over the outer trace portion 114D of the conductive traces 114 exposed on the top of the polymer coating 116. The top cover layer 124 is an insulating polymer film. The bottom cover layer 118 and the top cover layer 124 may be formed of a plastic, such as polyimide, among others.

In some aspects, the first section 108A of the flexible circuit 108 outside the enclosure includes a first layer of conductive traces 114C disposed between the polymer coating 116 and a bottom cover layer 118.

In some aspects, the second section 108B of the flexible circuit 108 inside the enclosure includes the first layer of the conductive traces 114C disposed between the polymer coating 116 and the bottom cover layer 118, and a second layer of the conductive traces 114D being routed to be exposed on the polymer coating 116.

In some aspects, the third section 108C of the flexible circuit 108 is coupled to the enclosure and substrate and includes the first layer of the conductive traces 114C disposed between the polymer coating 116 and the bottom cover layer 118, and a second layer of the conductive traces 114D being routed to be between the polymer coating 116 and a top cover layer 124.

In some aspects, the first section 108A of the flexible circuit outside the enclosure is longer than the second section 108B inside the enclosure.

The package 100A may also include an adhesive layer 110A that bonds the third section of the flexible circuit 108 to the outer edge portion 102A of the substrate 102, and an adhesive layer 110B that bonds the third section of the flexible circuit 108 to a bottom portion of the sidewall 105.

In some aspects, one or more internal components are mounted on a portion of the flexible circuit inside the enclosure.

FIG. 10 illustrates a cross-sectional view of the hermetic or near-hermetic package including a flexible circuit with a lid and internal components mounted on a portion of the flexible circuit in accordance with an embodiment of the disclosure. As shown in FIG. 10, the hermetic or near-hermetic package 100B may include the lower base substrate 102, a ceramic layer 103 disposed over the low base substrate 102, the upper enclosure 104 (e.g. ring frame), and the flexible circuit 108. The hermetic or near-hermetic package 100B has a hermetic seal or near-hermetic seal from moisture. The lower base substrate 102 includes an outer edge portion 102A corresponding to the bottom of the sidewall 105 of the enclosure or ring frame. The lower base substrate 102 also includes an inner portion 102B inside the sidewall 105.

The package 100B integrates the flexible circuit 108 for the signal I/O. The components 112 can be mounted onto the flexible circuit 108. Cavity 120 can be sealed to form a hermetic or near-hermetic package.

The flexible circuit 108 may include a first section 108A extending from the sidewall 105 of enclosure 104 to be away from enclosure 104. and a second section 108B extending into the enclosure 104. The flexible circuit 108 may also include a third section 108C joining to the substrate and the enclosure. The second section 108B of the flexible circuit is disposed over the substrate 102.

In some aspects, the second section 108B of the flexible circuit 108 may be disposed over the ceramic layer 103, which is disposed over the substrate 102. The substrate 102 may be formed of FR4, which is a composite material including fiberglass embedded in epoxy and is flame resistant. The flexible circuit is attached to the ceramic layer 103 by using the adhesive layer 110A, which can be a conductive adhesive or a non-conductive adhesive.

The flexible circuit 108 is in electrical communication or optical communication, or electrical and optical communications with the internal components 112. The flexible circuit 108 can extend into the sidewall 105 of the enclosure, with the second section inside the enclosure. The flexible circuit 108 can extend from the sidewall 105 of enclosure 104, with the first section outside the enclosure being away from the enclosure.

The flexible circuit 108 may include conductive traces 114 between a polymer coating 116 and a bottom cover layer 118, which is an insulating polymer film. The polymer coating 116 and the bottom cover layer 118 may be formed of polyimide, among others.

The conductive traces 114 are configured to connect to the electrical components or optical components 112 inside the enclosure 104 for inputting or outputting electrical signals, optical signals, or a combination of both electrical and optical signals. The conductive trace 114 is configured to connect to an external component for outputting a signal, for example, the flexible circuit may be connected to a PCB. For example, the conductive traces 114 may include the inner end portion 114A that is inside sidewall 105 of enclosure 104. The inner end portion 114A may extend below the polymer coating 116 and protrude from the polymer coating 116. The inner end portion 114A may also be exposed from the polymer coating 116.

Internal components 112 are mounted on a conductive layer 114E which is disposed over the inner portion 102B of the substrate 102. The conductive layer 114E is connected to the inner end portion 114A, which connects to the outer end portion 114B through the connection trace 114C. The internal components 112 can be either electrical components, optical components, or a combination of both. The upper enclosure 104 includes the cavity 120 surrounding the internal components 112.

The conductive traces 114 may also include the output end portion 114B that is outside the enclosure 104 and can be connected to an external component. The conductive traces 114 may also include a first conductive trace portion 114C that can connect the output end portion 118B to the components 112 through the inner end portion 114A. The conductive traces 114 may also include a second conductive trace portion 114F that is under the sidewall 105 and is on an opposite side of the first conductive trace portion 114C. The conductive traces 114 may further include an outer conductive trace portion 114D routed on the top of the polymer coating 116. The outer conductive trace portion 114D is under the bottom of the sidewall 105 of the enclosure. The outer conductive trace portion 114D may be configured as part of a ground path. The first conductive trace portion 114C may be configured as a conductive signal trace for signal inputs and outputs. The second conductive trace portion 114F is electrically connected to the outer conductive trace portion 114D by via 114H, such that the enclosure may be connected to outer conductive trace portion 114D by a conductive adhesive 110B, and the outer conductive trace portion 114D and the second conductive trace portion 114F may be grounded. The second conductive trace portion 114F is electrically separated from the first conductive trace portion 114C.

In some variations, the conductive layer 114E and the outer conductive trace portion 114D is in a first metal layer M1, while the first conductive trace portion 114C and second conductive trace portions 114F are in a second metal layer M2.

The flexible circuit 108 may also include a top cover layer 124 disposed over the outer conductive trace portion 114D of the conductive traces 114 exposed on the top of the polymer coating 116. The top cover layer 124 is an insulating polymer film. The bottom cover layer 118 and the top cover layer 124 may be formed of a plastic, such as polyimide, among others.

The package 100B may also include the adhesive layer 110A that bonds the third section of the flexible circuit 108 to the outer edge portion 102A of the substrate 102, and the adhesive layer 110B that bonds the third section of the flexible circuit 108 to the bottom portion of the sidewall 105, similar to package 100A.

In some aspects, the adhesive layer 110B may be a conductive adhesive, which electrically connects the enclosure to the flexible circuit to provide an electrical ground connection. Also, the adhesive layer 110A may be a conductive adhesive, which electrically connects the flexible circuit to the substrate to provide an electrical ground connection. As such, the enclosure, flexible circuit, and the substrate can serve as a ground.

Figure 1D:
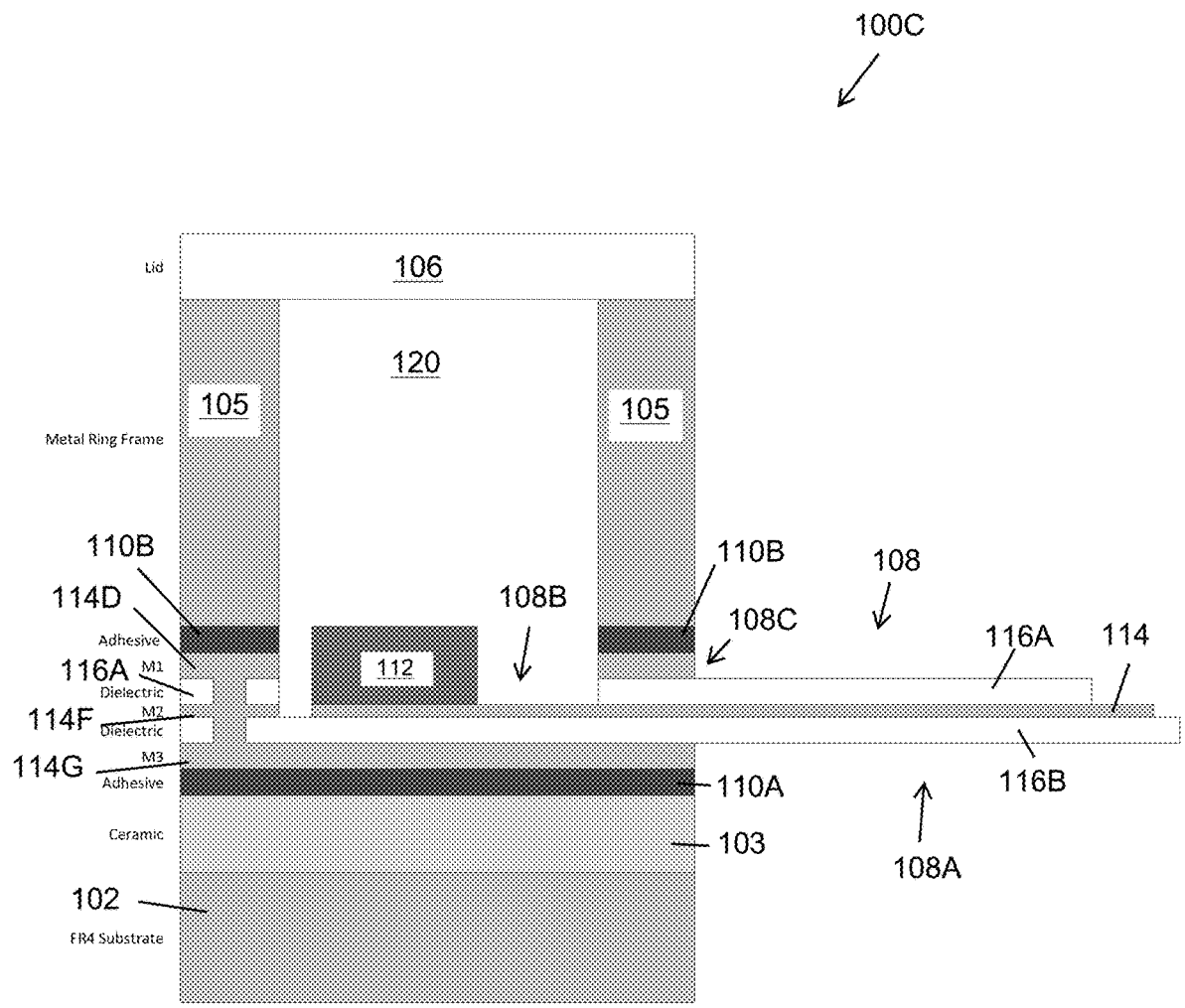

FIG. 1D illustrates a cross-sectional view of the hermetic or near-hermetic package including a flexible circuit with a lid and internal components mounted on a portion of the flexible circuit in accordance with another embodiment of the disclosure. As shown in FIG. 10, the hermetic or near-hermetic package 100C may include the lower base substrate 102, a ceramic layer 103 disposed over the low base substrate 102, the upper enclosure 104 (e.g. ring frame), and the flexible circuit 108. The component 112 may be mounted on the internal portion 108B of the flexible circuit.

The hermetic or near-hermetic package 100C may include a third metal layer M3 or 114G that connects to the second metal layer M2 or 114F and also connects to the first metal layer M1 or 114D by via 114H. A conductive trace 114 in the second metal layer M2 may be connected to the component 112 and configured for signal input and output. The conductive trace is covered by a top dielectric layer 116A and a bottom dielectric layer 116B, which may be formed of an insulating material, such as polymer.

The package 100A, 100B, or 100C may also include a lid or cover 106 that covers the top of the sidewall 105 of the enclosure 104 to seal the package.

In some embodiments, the cavity 120 inside the enclosure may be filled, potted, or encapsulated with a polymer, such as epoxy.

In some embodiments, enclosure 104 and lid or cover 106 may be combined into a single-piece.

In some aspects, electronic components can be mounted inside the package on the base substrate and connected to the flexible circuit by wire bonds or leads.

In some aspects, electronic components can be mounted inside the package on the flexible circuit by using standard surface mount methods.

The package materials can be selected to meet specific needs for the application, for example, including cost and weight, the properties of the package materials, such as Coefficient of Thermal Expansion (CTE), thermal conductivity, electrical shielding, among others.

In some aspects, different materials may be combined for different sections in the package. One example is the base substrate can be formed of a ceramic for high thermal conductivity and a low CTE, while the ring frame can be formed of plastic for weight reduction.

In some aspects, the flexible circuit may use polyimide or any other known flexible circuit material, among others.

In some aspects, the flexible circuit may have a thickness selected to reduce stress and obtain specific electric properties.

In some aspects, the PCB may include circuitry on one or more surfaces.

EXAMPLES

The following examples are for illustration purposes only. It will be apparent to those skilled in the art that many modifications, both to materials and methods, may be practiced without departing from the scope of the disclosure.

Base Substrate

The substrate material may have a few options and may be selected based upon a combination of factors including cost, CTE, thermal conductivity, and electrical performance (Dk).

The substrate may be formed of a ceramic material, such as $Al_2O_3$, AlN, Low-Temperature Co-Fired Ceramic (LTCC), High-Temperature Co-Fired Ceramic (HTCC), Si, among others. The ceramic material may provide the CTE that matches the CTE of ICs. The ceramic material may also have low CTE, which may reduce due to temperature change. The ceramic material also has very low permeability, which is desirable for hermetic seals. The ceramic material may provide the proper thermal conductivity to dissipate heat generated by components mounted inside the package. The ceramic material may have the desired mechanical strength. The ceramic substrate may be metalized to provide electrical shielding or to rout electric traces on.

The substrate may be formed of a metal, such as Cu, Al, or Ni—Co ferrous alloys (Trademark is Kovar), among others. The metal may be selected for its low-cost and easy fabrication. The metal may also be selected for its high thermal conductivity to dissipate heat generated by components mounted inside the package. The metal may further be selected for its high electrical conductivity, which allows the substrate to act as an electrical ground or electromagnetic shielding. The metal may also be selected for its very low permeability, which is good for hermetic seal. The metal may also be selected for its weldability or solderability.

The substrate may also be formed of plastic for its low material cost, low density or low weight, and low manufacturing cost (e.g. injection molding). In some aspects, the plastic may include epoxy, polyimide, PTFE, common PCB materials, among others.

The substrate may be formed of PCB materials, which have additional signal routing layers and also low material cost, and easy manufacturing. The PCB materials may include FR4, polyimide, liquid crystal polymers (LCP), polytetrafluoroethylene (PTFE), thermosets, and thermoplastics, among others. With respect to low permeability, LCP and polyimides are better than other PCB materials.

In some aspects, the substrate may also be non-metalized pre-fired.

In some aspects, the substrate may include circuitry on one or more surfaces.

In some aspects, the substrate may include a multilayer with embedded circuitry.

Enclosure

The enclosure material can be selected to meet specific needs for the application, for example, including cost and weight, the material properties, such as CTE, thermal conductivity, electrical shielding, among others.

The enclosure, such as ring frame and lid, can be formed of a metal, such as copper, aluminum, steel, other metal alloys, among others.

The enclosure may also be formed of a ceramic, including LTCC, HTCC, aluminum nitride, alumina, BeO, or Si, among others.

The enclosure may also be formed of plastics or polymers, including epoxy, polyimide, PTFE, or common PCB materials, among others.

In some aspects, the base substrate and/or the enclosure may be plated to prevent oxidation or promote soldering.

It will be appreciated by those skilled in the art that the shape of the enclosure or ring frame may vary for various applications.

Example Dimensions

In some variations, the substrate may have a thickness ranging from 50 microns to 750 microns.

In some variations, the substrate may have a thickness equal to or greater than 50 microns. In some variations, the substrate may have a thickness equal to or greater than 250 microns. In some variations, the substrate may have a thickness equal to or greater than 500 microns.

In some variations, the substrate may have a thickness equal to or less than 750 microns. In some variations, the substrate may have a thickness equal to or less than 500 microns. In some variations, the substrate may have a thickness equal to or less than 250 microns.

In some variations, the adhesive layer may have a thickness ranging from 12 microns to 250 microns.

In some variations, the adhesive may have a thickness equal to or greater than 12 microns. In some variations, the adhesive may have a thickness equal to or greater than 50 microns. In some variations, the adhesive may have a thickness equal to or greater than 150 microns.

In some variations, the adhesive may have a thickness equal to or less than 250 microns. In some variations, the adhesive may have a thickness equal to or less than 150 microns. In some variations, the adhesive may have a thickness equal to or less than 50 microns.

In some variations, the metal layers for the conductive traces in the flexible circuit may have a thickness ranging from 8 microns to 125 microns.

In some variations, the metal layers for the conductive traces may have a thickness equal to or greater than 8 microns. In some variations, the metal layers for the conductive traces may have a thickness equal to or greater than 50 microns. In some variations, the metal layers for the conductive traces may have a thickness equal to or greater than 80 microns.

In some variations, the metal layers for the conductive traces may have a thickness equal to or less than 125 microns. In some variations, the metal layers for the conductive traces may have a thickness equal to or less than 80 microns. In some variations, the metal layers for the conductive traces may have a thickness equal to or less than 50 microns.

In some variations, the polymer coating of the flexible circuit may have a thickness ranging from 25 microns to 250 microns.

In some variations, the polymer coating of the flexible circuit may have a thickness equal to or greater than 25 microns. In some variations, the polymer coating of the flexible circuit may have a thickness equal to or greater than 100 microns. In some variations, the polymer coating of the flexible circuit may have a thickness equal to or greater than 175 microns.

In some variations, the polymer coating of the flexible circuit may have a thickness equal to or less than 250 microns. In some variations, the polymer coating of the flexible circuit may have a thickness equal to or less than 175 microns. In some variations, the polymer coating of the flexible circuit may have a thickness equal to or less than 100 microns.

In some variations, the cover layer of the flexible circuit may have a thickness ranging from 25 microns to 250 microns.

In some variations, the cover layer of the flexible circuit may have a thickness equal to or greater than 25 microns. In some variations, the cover layer of the flexible circuit may have a thickness equal to or greater than 100 microns. In some variations, the cover layer of the flexible circuit may have a thickness equal to or greater than 175 microns.

In some variations, the cover layer of the flexible circuit may have a thickness equal to or less than 250 microns. In some variations, the cover layer of the flexible circuit may have a thickness equal to or less than 175 microns. In some variations, the cover layer of the flexible circuit may have a thickness equal to or less than 100 microns.

In some variations, the ring frame may be formed of copper and may have a thickness ranging from 500 microns to 3000 microns.

In some variations, the ring frame may have a thickness equal to or greater than 500 microns. In some variations, the ring frame may have a thickness equal to or greater than 1500 microns. In some variations, the ring frame may have a thickness equal to or greater than 2500 microns.

In some variations, the ring frame may have a thickness equal to or less than 3000 microns. In some variations, the ring frame may have a thickness equal to or less than 2500 microns. In some variations, the ring frame may have a thickness equal to or less than 1500 microns.

In some variations, the lid may have a thickness ranging from 125 microns to 1250 microns.

In some variations, the lid may have a thickness equal to or greater than 125 microns. In some variations, the lid may have a thickness equal to or greater than 400 microns. In some variations, the lid may have a thickness equal to or greater than 800 microns.

In some variations, the lid may have a thickness equal to or less than 1250 microns. In some variations, the lid may have a thickness equal to or less than 800 microns. In some variations, the lid may have a thickness equal to or less than 400 microns.

It will be appreciated by those skilled in the art that the dimensions may vary and are not limited to the above ranges for a particular application.

Joining Flexible Circuit to Substrate and Enclosure

In some aspects, adhesives may be used for joining the flexible circuit to the substrate and enclosure. The adhesives may include a thermoset adhesive, such as epoxy. The thermoset adhesive may be in sheet form for PCB-type manufacturing. The thermoset adhesive may also be dispensed for individual unit manufacturing. The adhesive may include a thermoplastic adhesive. The adhesive may also be a pressure-sensitive adhesive.

In some aspects, a fusion bond may be used for direct bonding of the flexible circuit to the substrate.

In some aspects, solder may be used for electrical connections between the substrate and the components.

In some aspects, the substrate may be formed of a ceramic selected from a group consisting of LTCC, HTCC, aluminum nitride, alumina, and BeO. The enclosure may be formed of plastic for reduced weight.

Examples of Flexible Circuit Connection to a PCB

The following examples illustrate the flexible signal I/O applications for the hermetic or near-hermetic package. The hermetic or near-hermetic package can be connected to a PCB, either on the same side as the package or on an opposite side from the package.

Figure 2A:
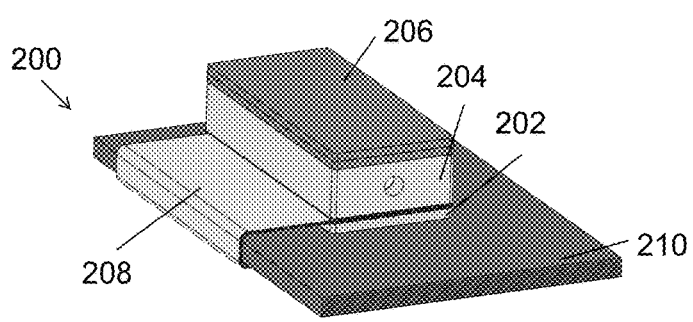
FIG. 2A illustrates a front perspective view of the hermetic or near-hermetic package including a flexible circuit connecting to the backside of a printed circuit board (PCB) from an edge of the PCB in accordance with an embodiment of the disclosure.
Figure 2B:
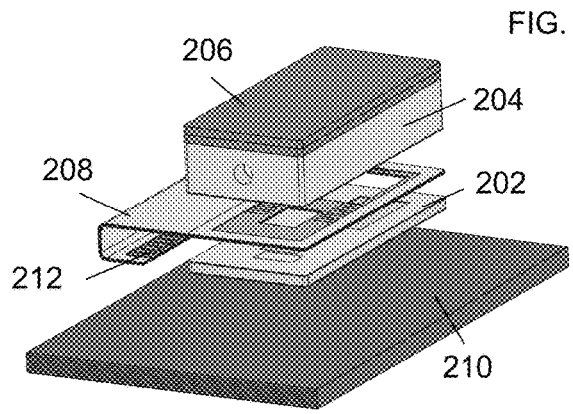
FIG. 2B illustrates a front perspective view of the hermetic or near-hermetic package of FIG. 2A prior to assembly in accordance with an embodiment of the disclosure.
Figure 2C:
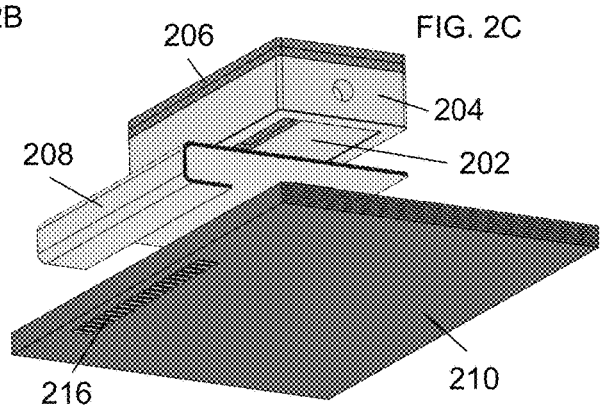
FIG. 2C illustrates a back perspective view of the hermetic or near-hermetic package of FIG. 2A prior to assembly in accordance with an embodiment of the disclosure.

FIGS. 2A-C illustrate one way to configure the flexible circuit to connect to the backside of a PCB from an edge of the PCB, while the package is on the top side of the PCB.

FIG. 2A illustrates a front perspective view of the hermetic or near-hermetic package including a flexible circuit connecting to the backside of a PCB from an edge of the PCB in accordance with an embodiment of the disclosure. As shown in FIG. 2A, a hermetic or near-hermetic package 200 includes a ring frame 204, a lid 206 on top of the ring frame 204, a substrate 202, and a flexible circuit 208 between the ring frame 204 and the substrate 202, which are assembled. The package 200 is placed on the front side or top side of a PCB 210. The package 200 is connected to the PCB 210 on an opposite side (e.g. backside or bottom side) from package 200. The flexible circuit 208 is folded around an edge 214 of the PCB 210.

FIG. 2B illustrates a front perspective view of the hermetic or near-hermetic package of FIG. 2A prior to assembly in accordance with an embodiment of the disclosure. As shown in FIG. 2B, the flexible circuit 208 includes a connection port 212 that is configured to connect to the opposite side of the PCB 210 from the package.

FIG. 2C illustrates a back perspective view of the hermetic or near-hermetic package of FIG. 2A prior to assembly in accordance with an embodiment of the disclosure. As shown in FIG. 2C, the connection port 212 of the flexible circuit 208 can connect to the port 216 of the PCB 210 on the backside.

Figure 3A:
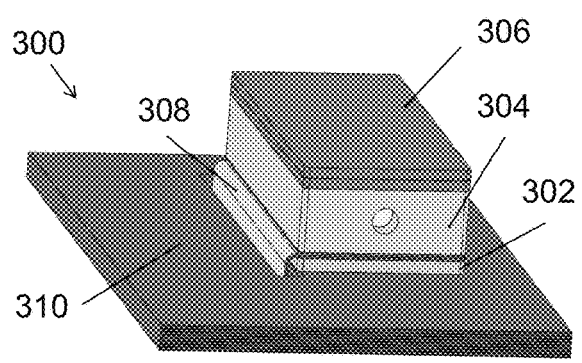
FIG. 3A illustrates a front perspective view of the hermetic or near-hermetic package including a flexible circuit connecting to the backside of a PCB through a slot in the PCB in accordance with an embodiment of the disclosure.
Figure 3B:
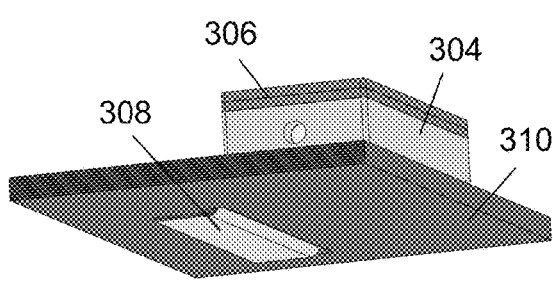
FIG. 3B illustrates a back perspective view of the hermetic or near-hermetic package of FIG. 3A in accordance with an embodiment of the disclosure.
Figure 3C:
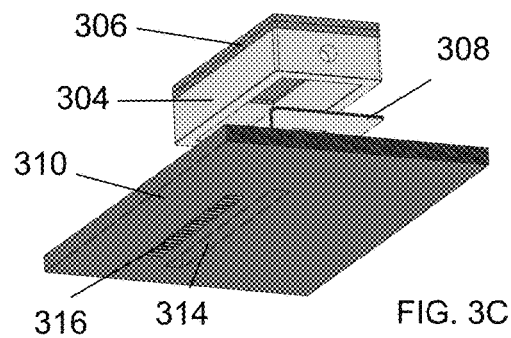
FIG. 3C illustrates a back perspective view of the hermetic or near-hermetic package of FIG. 3A prior to assembly in accordance with an embodiment of the disclosure.
Figure 3D:
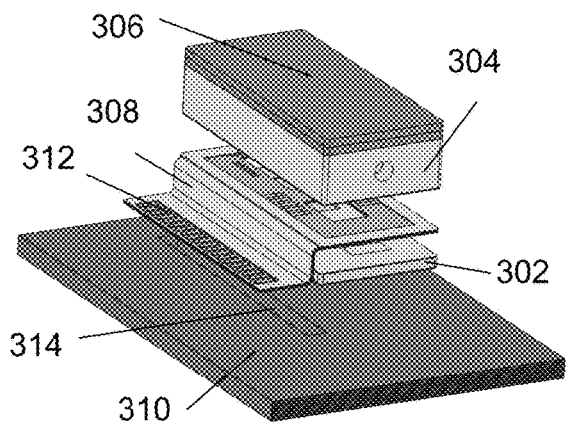
FIG. 3D illustrates a front perspective view of the hermetic or near-hermetic package of FIG. 3A prior to assembly in accordance with an embodiment of the disclosure.

FIGS. 3A-D illustrate another way to configure the flexible circuit to connect to the backside of a PCB through a slot in the PCB, while the package is on the top side of the PCB. FIG. 3A illustrates a front perspective view of the hermetic or near-hermetic package including a flexible circuit connecting to the backside of a PCB through a slot in the PCB in accordance with an embodiment of the disclosure. FIG. 3B illustrates a back perspective view of the hermetic or near-hermetic package of FIG. 3A in accordance with an embodiment of the disclosure. FIG. 3C illustrates a back perspective view of the hermetic or near-hermetic package of FIG. 3A prior to assembly in accordance with an embodiment of the disclosure. FIG. 3D illustrates a front perspective view of the hermetic or near-hermetic package of FIG. 3A prior to assembly in accordance with an embodiment of the disclosure.

As shown in FIGS. 3A-D, a hermetic or near-hermetic package 300 includes a ring frame 304, a lid 306 on top of the ring frame 304, a substrate 302, and a flexible circuit 308 between the ring frame 304 and the substrate 302, which are assembled. The package 300 is placed on the front side or top side of a PCB 310. The flexible circuit 308 includes a connection port 312 that faces up and is configured to connect to the opposite side (backside or bottom side) of the PCB 310 from the package. The connection port 312 of the flexible circuit 308 can connect to port 316 of the PCB 310 on the backside. The package 300 is connected to the PCB 310 on an opposite side (e.g. backside) from package 300 through slot 314 on the PCB.

Figure 4A:
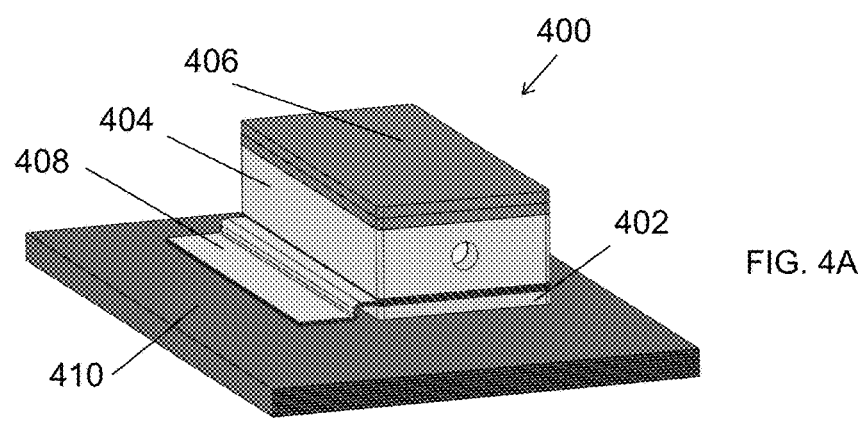
FIG. 4A illustrates a front perspective view of the hermetic or near-hermetic package including a flexible circuit close to a PCB and connecting to the front side of the PCB in accordance with an embodiment of the disclosure.
Figure 4B:
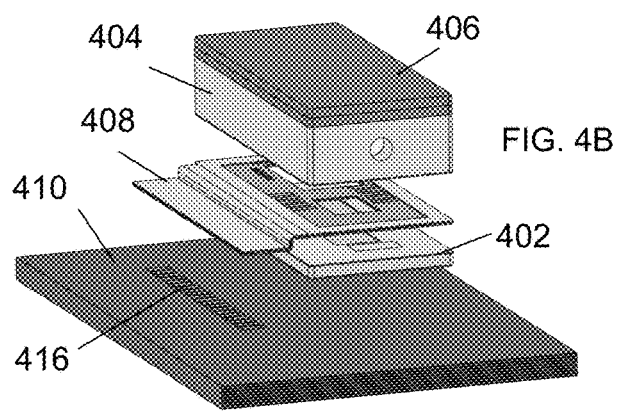
FIG. 4B illustrates a front perspective view of the hermetic or near-hermetic package of FIG. 4A prior to assembly in accordance with an embodiment of the disclosure.
Figure 4C:
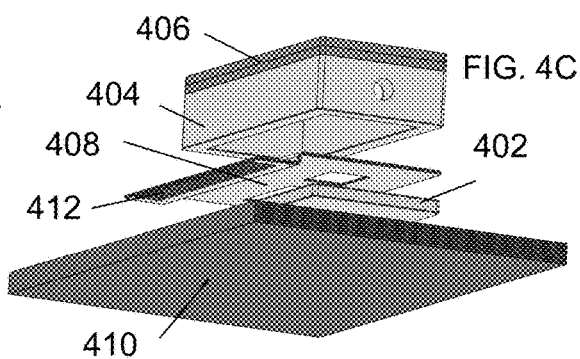
FIG. 4C illustrates a back perspective view of the hermetic or near-hermetic package of FIG. 4A prior to assembly in accordance with an embodiment of the disclosure.
Figure 5A:
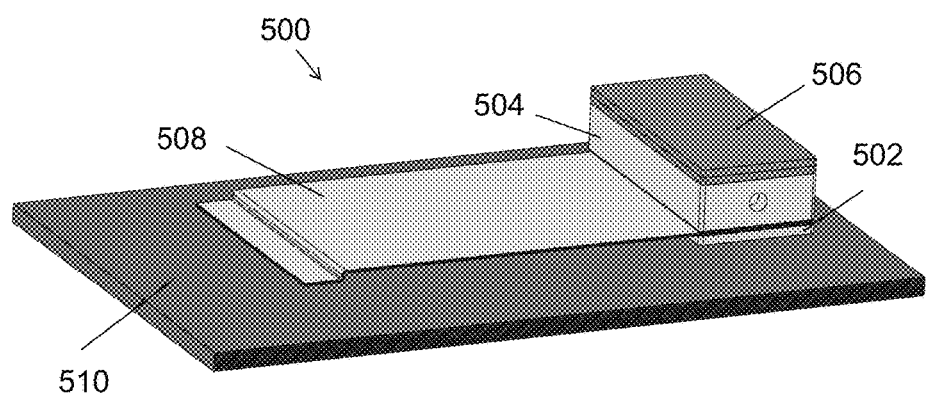
FIG. 5A illustrates a front perspective view of the hermetic or near-hermetic package including a flexible circuit away from a PCB and connecting to the front side of the PCB in accordance with an embodiment of the disclosure.
Figure 5B:
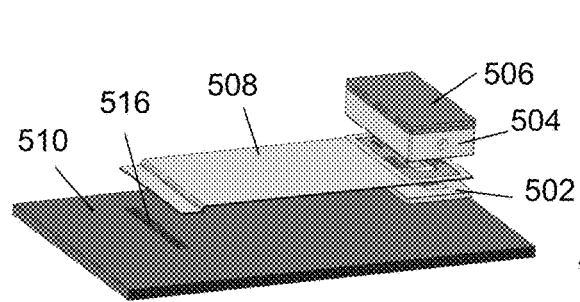
FIG. 5B illustrates a front perspective view of the hermetic or near-hermetic package of FIG. 5A prior to assembly in accordance with an embodiment of the disclosure.
Figure 5C:
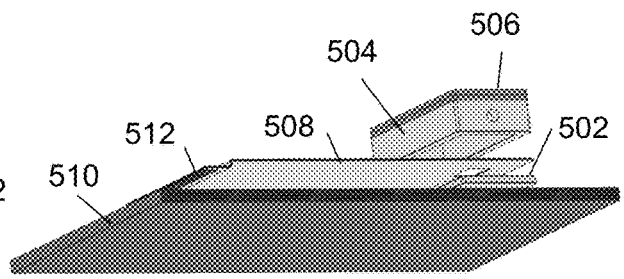
FIG. 5C illustrates a back perspective view of the hermetic or near-hermetic package of FIG. 5A prior to assembly in accordance with an embodiment of the disclosure.

The package can be on the opposite side of the PCB, such as shown in FIGS. 4A-C and 5A-C. The flexible circuit may vary in length to allow the hermetic or near-hermetic package to be either close to a PCB as shown in FIGS. 4A-C, or away from the PCB as shown in FIGS. 5A-C below.

FIG. 4A illustrates a front perspective view of the hermetic or near-hermetic package including a flexible circuit close to a PCB and connecting to the front side of the PCB in accordance with an embodiment of the disclosure. FIG. 4B illustrates a front perspective view of the hermetic or near-hermetic package of FIG. 4A prior to assembly in accordance with an embodiment of the disclosure. FIG. 4C illustrates a back perspective view of the hermetic or near-hermetic package of FIG. 4A prior to assembly in accordance with an embodiment of the disclosure.

As shown in FIGS. 4A-C, a hermetic or near-hermetic package 400 includes a ring frame 404, a lid 406 on top of the ring frame 404, a substrate 402, and a flexible circuit 408 between the ring frame 404 and the substrate 402, which are assembled. The package 400 is placed on the front side or top side of a PCB 410. The flexible circuit 408 includes a connection port 412 that is configured to connect to the same side (e.g. front side or top side) of the PCB 410 from the package. The connection port 412 of the flexible circuit 408 can connect to port 416 of the PCB 410 on the backside.

FIG. 5A illustrates a front perspective view of the hermetic or near-hermetic package including a flexible circuit away from a PCB and connecting to the front side of the PCB in accordance with an embodiment of the disclosure.

FIG. 5B illustrates a front perspective view of the hermetic or near-hermetic package of FIG. 5A prior to assembly in accordance with an embodiment of the disclosure. FIG. 5C illustrates a back perspective view of the hermetic or near-hermetic package of FIG. 5A prior to assembly in accordance with an embodiment of the disclosure.

As shown in FIGS. 5A-C, a hermetic or near-hermetic package 500 includes a ring frame 504, a lid 506 on top of the ring frame 504, a substrate 502, and a flexible circuit 508 between the ring frame 504 and the substrate 502, which are assembled. The package 500 is placed on the front side or top side of a PCB 510. The flexible circuit 508 includes a connection port 512 that is configured to connect to the same side (e.g. front side or top side) of the PCB 510 from the package. The connection port 512 of the flexible circuit 508 can connect to port 516 of the PCB 510 on the backside. The flexible circuit 500 extends away from the package.

Figure 6:
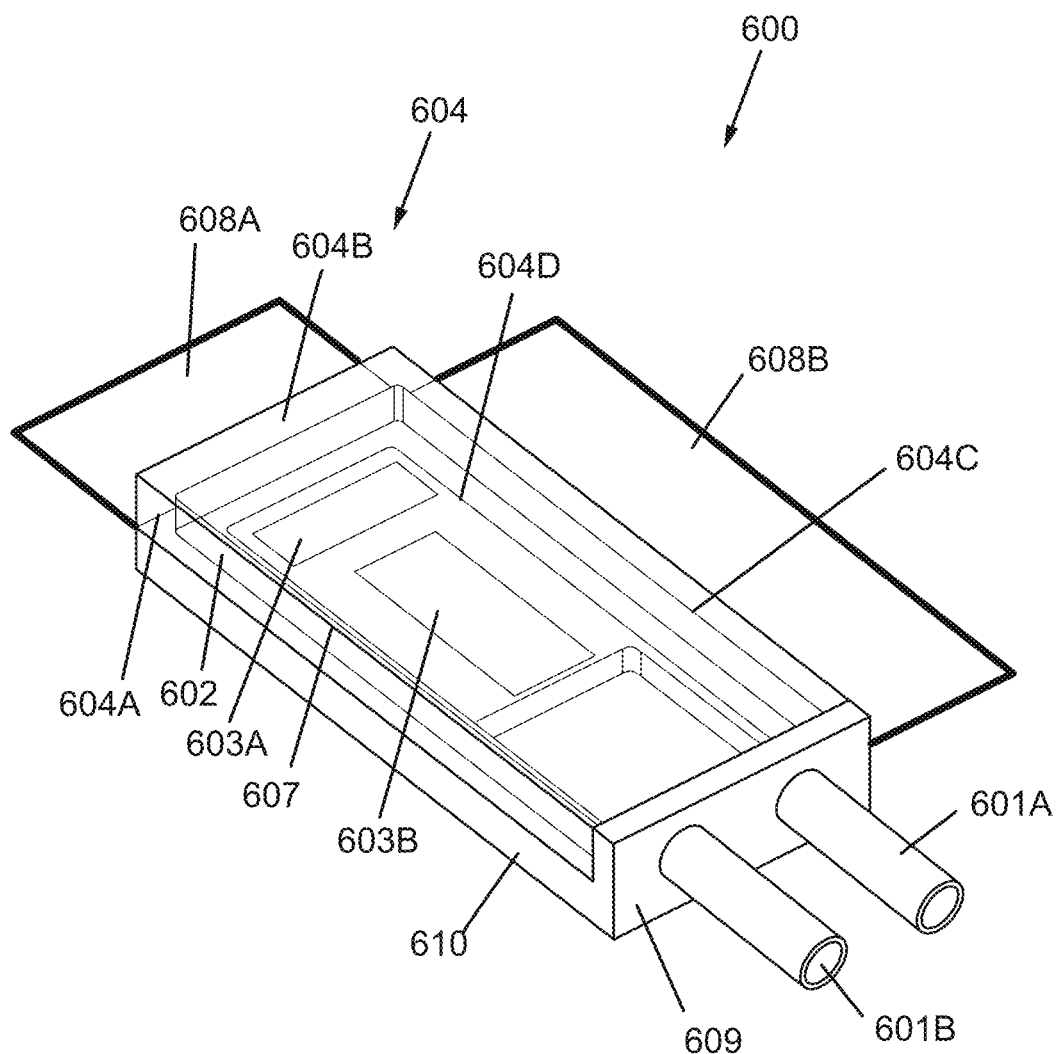
FIG. 6 illustrates a top perspective view of the hermetic or near-hermetic package including two flexible circuits attached to two sides of an enclosure in accordance with an embodiment of the disclosure.

FIG. 6 illustrates a top perspective view of the hermetic or near-hermetic package including two flexible circuits attached to two sides of an enclosure in accordance with an embodiment of the disclosure. As illustrated, a hermetic or near-hermetic package 600 may include an integrated circuit (IC) carrier 602 or a substrate 602, and internal components (ICs) 603A-B mounted on the IC carrier 602 which is mounted on a base 610. The ICs 603A-B may be fitted within a cavity 607 inside an enclosure 604. The IC carrier 602 may be formed of ceramic which has high thermal conductivity and also has coefficient of thermal expansion (CTE) matched to the CTE of the ICs 603A-B. The hermetic or near-hermetic package 600 may also include the base 610 supporting the IC carrier 602 and the enclosure 604 coupled to the base 610.

The enclosure 604 may include three sidewalls 604A-C extending vertically from the base 610. The enclosure 604 may also include a sidewall 609 extending from the base 610. The enclosure 604 may also include a top cover 606D that is coupled to the sidewalls 604A-C and the sidewall 609 to seal internal components 603A and 603B from moisture.

In some variations, the sidewall 609 may be integrated with the base 610, while the sidewalls and the top cover may be integrated as illustrated.

In some variations, the package may be disposed over a base. The base may include a sidewall that forms a portion of the enclosure. The enclosure may include a portion of the base.

The hermetic or near-hermetic package 600 also include first and second flexible circuits 608A and 608B supported by the base 610. The first flexible circuit 608A may extend outward from a first side of the enclosure 604. The second flexible circuit 608A may extend outward from a second side of the enclosure 604. Wire bonds may be used to connect the ICs 603A-B to the flexible circuits 608A-B.

The package 600 is placed on the top side of the base 610. The sidewall 609 may include two holes configured for signal inputs 601A and 601B to the components 603A and 603B inside the enclosure 604. It will be appreciated by those skilled in the art that the sidewall 609 may include one hole or more holes configured for signal inputs.

Figure 7A:
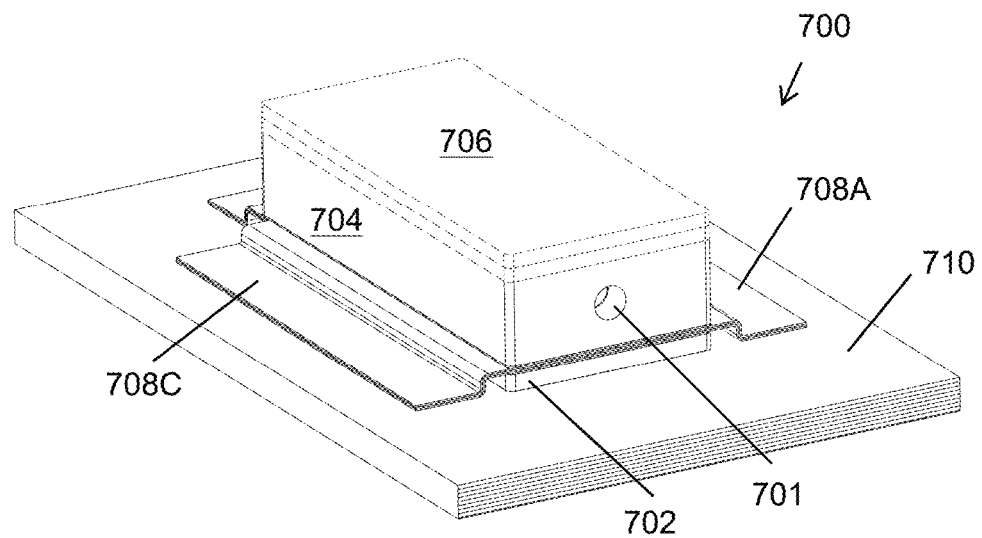
FIG. 7A illustrates a front perspective view of the hermetic or near-hermetic package including three flexible circuits attached to three sides of an enclosure in accordance with an embodiment of the disclosure.
Figure 7B:
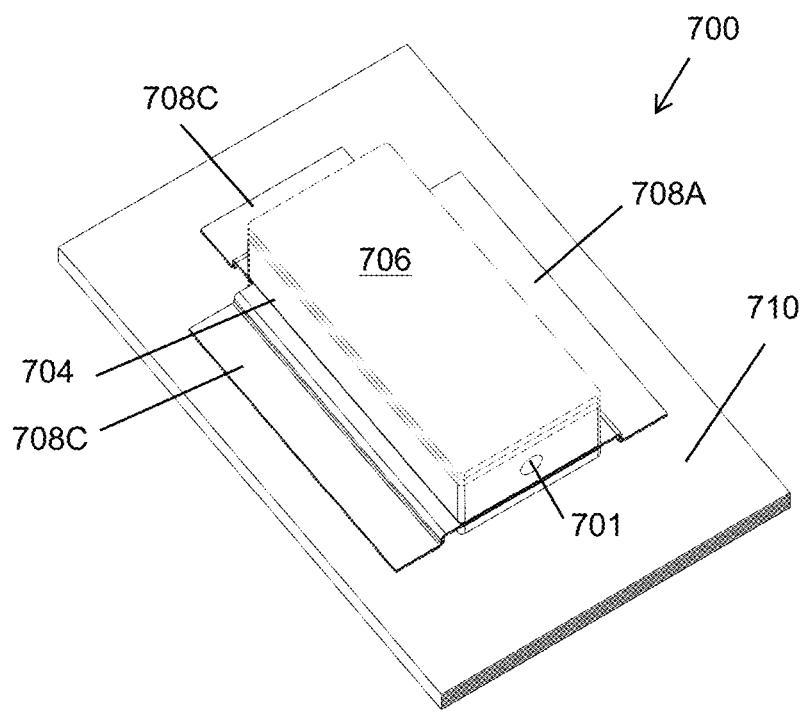
FIG. 7B illustrates a top perspective view of the hermetic or near-hermetic package including three flexible circuits attached to the three sides of the enclosure of FIG. 7A in accordance with an embodiment of the disclosure.

FIG. 7A illustrates a front perspective view of the hermetic or near-hermetic package including three flexible circuits attached to three sides of an enclosure in accordance with an embodiment of the disclosure. FIG. 7B illustrates a top perspective view of the hermetic or near-hermetic package including three flexible circuits attached to the three sides of the enclosure of FIG. 7A in accordance with an embodiment of the disclosure. As illustrated, a hermetic or near-hermetic package 700 includes an enclosure 704, a cover 706 on the top of the enclosure 704, a substrate 702. The enclosure 704 is coupled to the substrate 702 to seal the components from moisture.

The hermetic or near-hermetic package 700 may also include first, second, and third flexible circuits 708A, 708B, and 708C, which extend outward between the enclosure 704 and the substrate 702 and include portions outside the enclosure 704. The first flexible circuit 708A may extend outward from a first side of the enclosure 704. The second flexible circuit 708A may extend outward from a second side of the enclosure 704. The third flexible circuit 708A may extend outward from a third side of the enclosure 704. The third side is opposite to the first side.

The package 700 is placed on the top side of a PCB 710. The flexible circuits 708A-C may be coupled to the PCB 710 with ports like the port 416 as illustrated in FIG. 4B.

The enclosure 704 includes a hole 701 on a sidewall configured for signal input to the components inside the enclosure 704. It will be appreciated by those skilled in the art that the sidewall 609 may include two or more holes configured for signal inputs.

Figure 8A:
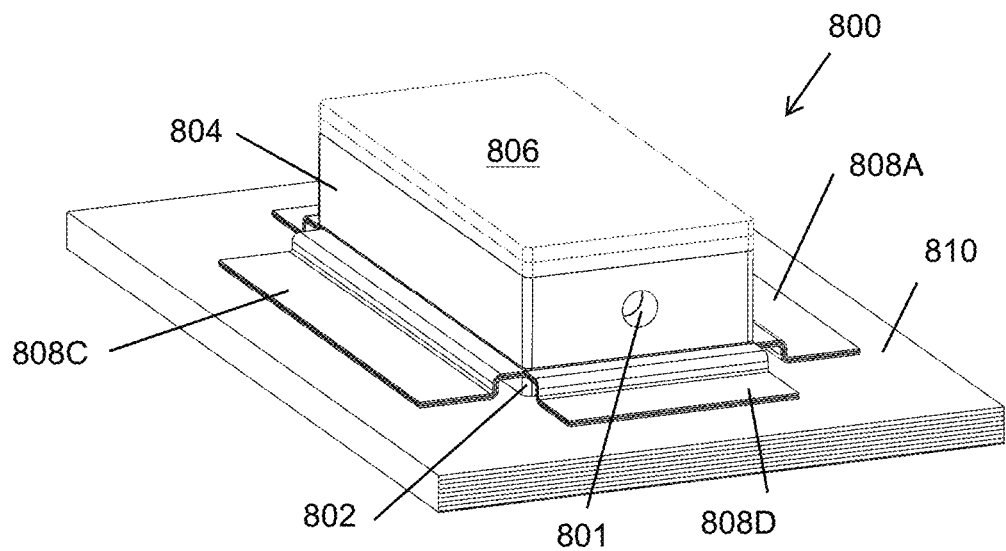
FIG. 8A illustrates a front perspective view of the hermetic or near-hermetic package including four flexible circuits attached to four sides of an enclosure in accordance with an embodiment of the disclosure.
Figure 8B:
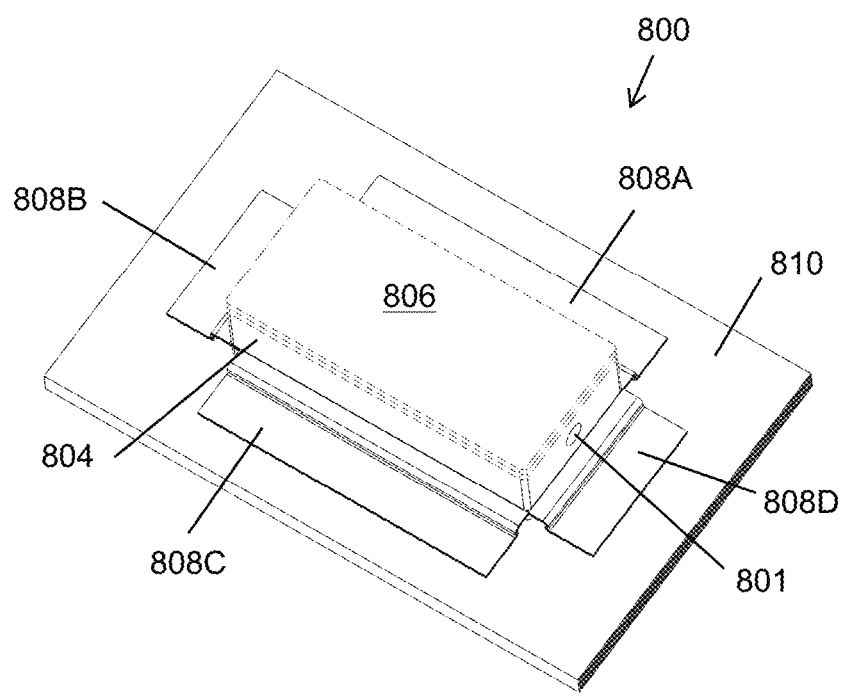
FIG. 8B illustrates a top perspective view of the hermetic or near-hermetic package including four flexible circuits attached to the four sides of the enclosure of FIG. 8A in accordance with an embodiment of the disclosure.

FIG. 8A illustrates a front perspective view of the hermetic or near-hermetic package including four flexible circuits attached to four sides of an enclosure in accordance with an embodiment of the disclosure. FIG. 8B illustrates a top perspective view of the hermetic or near-hermetic package including four flexible circuits attached to the four sides of the enclosure of FIG. 8A in accordance with an embodiment of the disclosure. As illustrated, a hermetic or near-hermetic package 800 includes an enclosure 804, a cover 806 on the top of the enclosure 804, a substrate 802. The enclosure 804 is coupled to the substrate 802 to seal the components from moisture.

The hermetic or near-hermetic package 800 may also include first, second, third, and fourth flexible circuits 808A, 808B, 808C, and 808D extending outward between the ring frame 804 and the substrate 802. The first, second, third and fourth flexible circuits 808A-D may extend outward from a first side, a second side, a third side, and a fourth side of the enclosure 804, respectively. The third side is opposite to the first side. The four side is opposite to the second side.

The package 800 is placed on the top side of a PCB 810. The flexible circuits 808A-D may be coupled to the PCB 810 with ports like the port 416 as illustrated in FIG. 4B.

The enclosure 804 includes a hole 801 on a sidewall configured for signal input to the components inside the enclosure 804. It will be appreciated by those skilled in the art that the sidewall 609 may include two or more holes configured for signal inputs.

In some aspects, the enclosure may include a first sidewall and a second sidewall extending upward from the substrate. The first and second sidewalls are coupled to the substrate.

In some aspects, the first and second flexible circuits are configured to connect to a PCB. Each of the first and second flexible circuits may include a first section outside the second sidewall of the enclosure, a second section inside the enclosure, and a third section between the first section and the second section joining to the enclosure and the substrate.

In some aspects, a package with a near-hermetic seal from moisture may include a substrate having an outer edge portion and an inner portion within the outer edge portion, one or more internal components being mounted on the inner portion of the substrate. The package may also include an enclosure comprising a cavity surrounding the one or more internal components and a sidewall extending upward from the substrate, the sidewall coupled to the outer edge portion of the substrate. The package may also include a flexible circuit comprising conductive traces configured to connect to the one or more internal components, the flexible circuit comprising a first section extending from the sidewall of the enclosure to be away from the enclosure.

In some aspects, the flexible circuit is in electrical communication or optical communication, or electrical and optical communications with the one or more internal components.

In some aspects, the flexible circuit may include a second section extending into the enclosure configured to connect to the one or more internal components, and a third section joining to the substrate and the enclosure, wherein the third section is between the first section and the second section.

In some aspects, a top surface of the third section of the flexible circuit is attached to a bottom of the sidewall of the enclosure, wherein a bottom surface of the third section of the flexible circuit is attached to the outer edge portion of the substrate.

In some aspects, the first section of the flexible circuit comprises a first layer of conductive traces disposed between a polymer coating and a bottom cover layer.

In some aspects, the second section of the flexible circuit comprises the first layer of the conductive traces disposed between the polymer coating and the bottom cover layer, and a second layer of the conductive traces being routed to be exposed on the polymer coating.

In some aspects, the third section of the flexible circuit comprises the first layer of the conductive traces disposed between the polymer coating and the bottom cover layer, and a second layer of the conductive traces being routed to be between the polymer coating and a top cover layer.

In some aspects, the enclosure may include a cover coupled to the sidewall.

In some aspects, the sidewall of the enclosure is electrically connected to a portion of the flexible circuit, wherein the portion of the flexible circuit is electrically connected to the substrate such that the enclosure and the substrate can serve as an electrical ground.

In some aspects, the one or more internal components may be potted or encapsulated inside the cavity by a thermoset polymer to seal the one or more internal components.

In some aspects, the enclosure may include a material different from the substrate.

In some aspects, the one or more internal components may be electrical components or optical components, or a combination.

In some aspects, the substrate may include one of a printed circuit board (PCB) comprising multiple layers with embedded circuitry, metal, or a ceramic selected from a group consisting of Low-Temperature Co-Fired Ceramic (LTCC), High-Temperature Co-Fired Ceramic (HTCC), aluminum nitride, alumina, and BeO.

In some aspects, the one or more internal components may be attached to the inner portion of the substrate by an adhesive or a solder.

In some aspects, one or more internal components may be mounted on a portion of the flexible circuit inside the enclosure.

In some aspects, a package with a near-hermetic seal from moisture may include a substrate configured to support one or more internal components. The package may also include an enclosure comprising a cavity surrounding the one or more internal components and a first sidewall and a second sidewall extending upward from the substrate. The first and second sidewalls may be coupled to the substrate. The package may also include a first flexible circuit comprising conductive traces configured to connect to the one or more internal components, the first flexible circuit comprising a first section outside the first sidewall of the enclosure, a second section inside the enclosure, and a third section between the first section and the second section joining to the enclosure and the substrate.

In some aspects, a PCB assembly may include the package and a PCB that supports the substrate and the enclosure of the package. The first flexible circuit may be configured to connect to the PCB such that the first flexible circuit is on the same side as the package or on an opposite side from the package.

In some aspects, a PCB assembly may include the package and a PCB that supports the substrate and the enclosure of the package. The first flexible circuit may be configured to connect to the PCB such that the first flexible circuit is away from the package or close to the package.

In some aspects, a PCB assembly may include the package and a second flexible circuit and a PCB that supports the substrate and the enclosure of the package. The first and second flexible circuits may be configured to connect to the PCB. The second flexible circuit may include a first section outside the second sidewall of the enclosure, a second section inside the enclosure, and a third section between the first section and the second section joining to the enclosure and the substrate.

In some aspects, a PCB assembly may include the package and a base that supports the package, wherein the base comprises a sidewall that forms a portion of the enclosure.

Any ranges cited herein are inclusive. The terms "substantially" and "about" used throughout this specification are used to describe and account for small fluctuations. For example, they can refer to less than or equal to ±5%, such as less than or equal to ±2%, such as less than or equal to ±1%, such as less than or equal to ±0.5%, such as less than or equal to ±0.2%, such as less than or equal to ±0.1%, such as less than or equal to ±0.05%.

Having described several aspects and embodiments, it will be recognized by those skilled in the art that various modifications, alternative constructions, and equivalents may be used without departing from the spirit of the invention. Additionally, a number of well-known processes and elements have not been described in order to avoid unnecessarily obscuring the invention. Accordingly, the above description should not be taken as limiting the scope of the invention.

Those skilled in the art will appreciate that the presently disclosed embodiments teach by way of example and not by limitation. Therefore, the matter contained in the above description or shown in the accompanying drawings should be interpreted as illustrative and not in a limiting sense. The following claims are intended to cover all generic and specific features described herein, as well as all statements of the scope of the method and system, which, as a matter of language, might be said to fall therebetween.

What is claimed is:

1. A package with a near-hermetic seal from moisture comprising: a substrate configured to support one or more internal components; an enclosure comprising a cavity surrounding the one or more internal components and a first sidewall extending upward from the substrate, the first sidewall coupled to the substrate; and a first flexible circuit comprising conductive traces configured to connect to the one or more internal components, the first flexible circuit comprising a first section outside the first sidewall of the enclosure, a second section inside the enclosure, and a third section between the first section and the second section joining to the enclosure and the substrate, wherein the substrate comprising an outer edge portion and an inner portion within the outer edge portion, the one or more internal components being mounted on the inner portion of the substrate, the first sidewall coupled to the outer edge portion of the substrate, and the first section extending from the sidewall of the enclosure to be away from the enclosure.

2. The package of claim 1, wherein the first flexible circuit is in electrical communication or optical communication, or electrical and optical communications with the one or more internal components.

3. The package of claim 1, wherein a top surface of the third section of the first flexible circuit is attached to a bottom of the first sidewall of the enclosure, wherein a bottom surface of the third section of the first flexible circuit is attached to the outer edge portion of the substrate.

4. The package of claim 1, wherein the one or more internal components are attached to the inner portion of the substrate by an adhesive or a solder.

5. The package of claim 1, wherein the first section of the first flexible circuit comprises a first layer of conductive traces disposed between a polymer coating and a bottom cover layer.

6. The package of claim 5, wherein the second section of the first flexible circuit comprises the first layer of the conductive traces disposed between the polymer coating and the bottom cover layer, and a second layer of the conductive traces being routed to be exposed on the polymer coating.

7. The package of claim 5, wherein the third section of the first flexible circuit comprises the first layer of the conductive traces disposed between the polymer coating and the bottom cover layer, and a second layer of the conductive traces being routed to be between the polymer coating and a top cover layer.

8. The package of claim 1, wherein the enclosure comprises a cover coupled to the first sidewall.

9. The package of claim 1, wherein the first sidewall of the enclosure is electrically connected to a portion of the flexible circuit, wherein the portion of the flexible circuit is electrically connected to the substrate such that the enclosure and the substrate can serve as an electrical ground.

10. The package of claim 1, wherein the one or more internal components are potted or encapsulated inside the cavity by a thermoset polymer to seal the one or more internal components.

11. The package of claim 1, wherein the enclosure comprises a material different from the substrate.

12. The package of claim 1, wherein the one or more internal components are electrical components or optical components, or a combination.

13. The package of claim 1, wherein the substrate comprises one of a printed circuit board (PCB) comprising multiple layers with embedded circuitry, metal, or a ceramic selected from a group consisting of Low-Temperature Co-Fired Ceramic (LTCC), High-Temperature Co-Fired Ceramic (HTCC), aluminum nitride, alumina, and BeO.

14. The package of claim 1, wherein one or more internal components are mounted on a portion of the flexible circuit inside the enclosure.

15. A PCB assembly with the package of claim 1, further comprising a PCB that supports the substrate and the enclosure of the package, wherein the first flexible circuit is configured to connect to the PCB such that the first flexible circuit is away from the package or close to the package.

16. A PCB assembly with the package of claim 1, further comprising a second flexible circuit and a PCB that supports the substrate and the enclosure of the package, wherein the first and second flexible circuits are configured to connect to the PCB, wherein the second flexible circuit comprises a first section outside the second sidewall of the enclosure, a second section inside the enclosure, and a third section between the first section and the second section joining to the enclosure and the substrate.

17. A PCB assembly with the package of claim 1, further comprising a base that supports the package, wherein the base comprises a sidewall that forms a portion of the enclosure.

18. A package with a near-hermetic seal from moisture comprising: a substrate configured to support one or more internal components; an enclosure comprising a cavity surrounding the one or more internal components and a first sidewall and a second sidewall extending upward from the substrate, the first and second sidewalls coupled to the substrate; and a first flexible circuit comprising conductive traces configured to connect to the one or more internal components, the first flexible circuit comprising a first section outside the first sidewall of the enclosure, a second section inside the enclosure, and a third section between the first section and the second section joining to the enclosure and the substrate, further comprising a PCB that supports the substrate and the enclosure of the package, wherein the first flexible circuit is configured to connect to the PCB such that the first flexible circuit is on the same side as the package or on an opposite side from the package.

\* \* \* \* \*